United States Patent
Park et al.

(10) Patent No.: US 11,004,841 B2
(45) Date of Patent: May 11, 2021

(54) SEMICONDUCTOR DEVICE HAVING MULTIPLE GATE PADS

(71) Applicant: VISHAY-SILICONIX, San Jose, CA (US)

(72) Inventors: Chanho Park, San Jose, CA (US); Ayman Shibib, San Jose, CA (US); Kyle Terrill, San Jose, CA (US)

(73) Assignee: VISHAY SILICONIX, LLC, San Jose, CA (US)

( * ) Notice: Subject to any disclaimer, the term of this patent is extended or adjusted under 35 U.S.C. 154(b) by 83 days.

(21) Appl. No.: 16/379,609

(22) Filed: Apr. 9, 2019

(65) Prior Publication Data

US 2019/0237458 A1   Aug. 1, 2019

Related U.S. Application Data

(62) Division of application No. 15/097,024, filed on Apr. 12, 2016, now Pat. No. 10,256,227.

(51) Int. Cl.
| | |
|---|---|
| *H01L 27/02* | (2006.01) |
| *H01L 21/48* | (2006.01) |
| *H01L 23/60* | (2006.01) |
| *H01L 21/66* | (2006.01) |
| *H01L 23/00* | (2006.01) |

(52) U.S. Cl.
CPC ...... *H01L 27/0266* (2013.01); *H01L 21/4853* (2013.01); *H01L 22/14* (2013.01); *H01L 22/32* (2013.01); *H01L 23/60* (2013.01); *H01L 24/03* (2013.01); *H01L 24/49* (2013.01); *H01L 27/0255* (2013.01); *H01L 27/0288* (2013.01); *H01L 24/48* (2013.01); *H01L 2224/0392* (2013.01); *H01L 2224/4813* (2013.01); *H01L 2224/48247* (2013.01); *H01L 2224/4912* (2013.01); *H01L 2924/00014* (2013.01); *H01L 2924/13091* (2013.01)

(58) Field of Classification Search
CPC ............ H01L 27/0266; H01L 27/0255; H01L 27/0288; H01L 21/4853; H01L 24/03; H01L 24/49; H01L 24/48; H01L 23/60
See application file for complete search history.

(56) References Cited

U.S. PATENT DOCUMENTS

| | | |
|---|---|---|
| 5,381,105 A | 1/1995 | Phipps |
| 5,900,643 A | 5/1999 | Preslar et al. |
| 6,114,878 A * | 9/2000 | Loughmiller ...... H03K 19/1731 326/101 |

(Continued)

*Primary Examiner* — Christine A Enad

(57) ABSTRACT

Disclosed are semiconductor devices that include additional gate pads, and methods of fabricating and testing such devices. A device may include a first gate pad, a second gate pad, and a third gate pad. The first gate pad is connected to a gate including a gate oxide layer. The second and third gate pads are part of an electro-static discharge (ESD) protection network for the device. The ESD protection network is initially isolated from the first gate pad and hence from the gate and gate oxide layer. Accordingly, gate oxide integrity (GOI) testing can be effectively performed and the reliability and quality of the gate oxide layer can be checked. The second gate pad can be subsequently connected to the first gate pad to enable the ESD protection network, and the third gate pad can be subsequently connected to an external terminal when the device is packaged.

11 Claims, 6 Drawing Sheets

(56) References Cited

U.S. PATENT DOCUMENTS

| | | |
|---|---|---|
| 6,180,426 B1 | 1/2001 | Lin |
| 6,657,835 B2 | 12/2003 | Ker et al. |
| 7,193,912 B2 | 3/2007 | Obara et al. |
| 8,704,223 B2 | 4/2014 | Yamagami et al. |
| 2004/0119118 A1* | 6/2004 | Williams ................ H01L 23/60 |
| | | 257/355 |
| 2005/0030688 A1* | 2/2005 | Sakihama ........... H01L 27/0285 |
| | | 361/91.1 |
| 2005/0202577 A1 | 9/2005 | Williams et al. |
| 2006/0061378 A1 | 3/2006 | Poechmuller |
| 2007/0262305 A1 | 11/2007 | Adkisson et al. |
| 2008/0290367 A1 | 11/2008 | Su et al. |
| 2009/0059999 A1 | 3/2009 | Shoda |
| 2010/0295567 A1 | 11/2010 | Chang |
| 2010/0318313 A1 | 12/2010 | Agarwal et al. |
| 2013/0147510 A1 | 6/2013 | Huang et al. |
| 2013/0238273 A1 | 9/2013 | Tercariol et al. |
| 2015/0221566 A1 | 8/2015 | Ookura |
| 2017/0262566 A1* | 9/2017 | Chiang ................ G06F 30/392 |

* cited by examiner

US 11,004,841 B2

SEMICONDUCTOR DEVICE HAVING MULTIPLE GATE PADS

RELATED U.S. APPLICATION

This application is a continuation (divisional) application of U.S. patent application Ser. No. 15/097,024, filed Apr. 12, 2016, by C. Park et al., entitled "Semiconductor Device Having Multiple Gate Pads," now U.S. Pat. No. 10,256,227 which is hereby incorporated by reference in its entirety.

BACKGROUND

Semiconductor devices are tested during fabrication to detect defects and demonstrate satisfactory performance. The testing is performed on devices (also known as dies) that are formed on, for example, a silicon wafer before the devices are diced (separated from the wafer and each other). By performing such testing at various points in the fabrication process, it's possible to identify which units are good and which units are defective or potentially defective. This can result in savings in cost and time, because the defective units need not be passed through the remainder of the fabrication process and/or undergo other testing at later stages of the fabrication process.

Gate oxide integrity (GOI) is of increasing importance for device manufacturers, especially because the thicknesses of the gate oxide layers in the devices are being reduced as the devices shrink in size. Producing reliable, high-quality gate oxide layers in semiconductor devices is therefore a critical task in semiconductor fabrication, and testing is performed during fabrication to check GOI. This testing includes subjecting the gate oxide layer of each device on the wafer to a stress test in which a voltage higher than the rated voltage is applied to the gate electrode.

Electro-static discharge (ESD) is an event that sends current through a semiconductor power device. To protect against ESD, many semiconductor devices incorporate ESD protection networks directly onto each device. However, once an ESD protection network is formed on a device, it is not possible to monitor characteristics such as GOI during the fabrication process. The leakage from the ESD protection networks is greater than the voltage applied to the gate oxide layer during the stress test. In other words, the higher voltage that is supposed to be applied to the gate oxide layer in the stress test is instead dissipated through the ESD protection network. While overall device characteristics can be measured with the ESD protection network in place, characteristics related to GOI are different from the overall device characteristics.

SUMMARY

In overview, in embodiments according to the present invention, a semiconductor device includes additional gate pads that are part of an electro-static discharge (ESD) protection network for the device. In an embodiment, the semiconductor device is fabricated on a wafer with other semiconductor devices. In an embodiment, the device includes a first gate pad, a second gate pad, and a third gate pad. In such an embodiment, the first gate pad is connected to the gate including the gate oxide layer, and the second and third gate pads are part of the ESD protection network. The first gate pad is initially electrically isolated from the second gate pad and from the third gate pad; thus, the ESD protection network is isolated from the gate. A voltage that is greater than the rated voltage can be applied to the first gate pad to stress test the gate oxide layer. Because the gate is isolated from the ESD protection network, the test voltage will not be dissipated away from the gate oxide layer. Consequently, gate oxide integrity (GOI) testing can be effectively performed and the reliability and quality of the gate oxide layer can be checked during the fabrication process while the device is still on the wafer. If the device does not pass the stress test, it can be skipped during subsequent fabrication steps and testing.

Sometime after the GOI testing is completed (after the test voltage is removed from the first gate pad), the first gate pad and the second gate pad are connected (e.g., wire-bonded), thereby enabling the ESD protection network.

In an embodiment, before the first gate pad and the second gate pad are connected, the ESD protection network is tested.

Once fabrication on the wafer is completed, the device is separated from the wafer and packaged. In an embodiment, as part of the packaging process, the third gate pad is connected (e.g., wire-bonded) to an external terminal. In an embodiment, after the device is packaged, it is tested.

In an embodiment, the first gate pad occupies less area than the third gate pad, and the second gate pad occupies less area than the third gate pad.

In an embodiment, the ESD protection network is a two-stage ESD network and includes a resistor and at least two Zener diodes. In another embodiment, the ESD protection network is a one-stage ESD network and includes a Zener diode.

In an embodiment, the semiconductor device is a vertical device such as a metal-oxide-semiconductor field-effect transistor (MOSFET).

Thus, embodiments according to the invention allow GOI testing to be performed while devices are mounted on a wafer. Defective units can be identified during the fabrication process, resulting in savings in cost and time because the defective units need not be passed through the remainder of the fabrication process and/or undergo other testing at later stages of the fabrication process. Devices can be individually tested, and characteristics of the gate oxide layer can be specifically tested. Consequently, devices with high-quality gate oxides can be produced and used in systems that require a high degree of reliability, such as but not limited to automotive systems.

These and other objects and advantages of embodiments according to the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification. The figures may not be drawn to scale.

DETAILED DESCRIPTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication and/or testing to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "applying," "removing," "forming," "connecting," "separating," or the like, refer to actions and processes (e.g., the flowchart 600 of FIG. 6) of semiconductor device fabrication and/or testing.

It is understood that the figures are not necessarily drawn to scale, and only portions of the devices and structures depicted, as well as the various layers that form those structures, are shown. For simplicity of discussion and illustration, processes may be described for one or two devices or structures, although in actuality more than one or two devices or structures may be formed.

The term "channel" is used herein in the accepted manner. That is, current moves within a metal-oxide-semiconductor field-effect transistor (MOSFET) in a channel, from the source connection to the drain connection. A channel can be made of either n-type or p-type semiconductor material; accordingly, a MOSFET is specified as either an n-channel or p-channel device. The disclosure is presented in the context of a p-channel device; however, embodiments according to the present invention are not so limited and this disclosure can be readily mapped to an n-channel device. That is, the features described herein can be utilized in an n-channel device.

Figure 1:
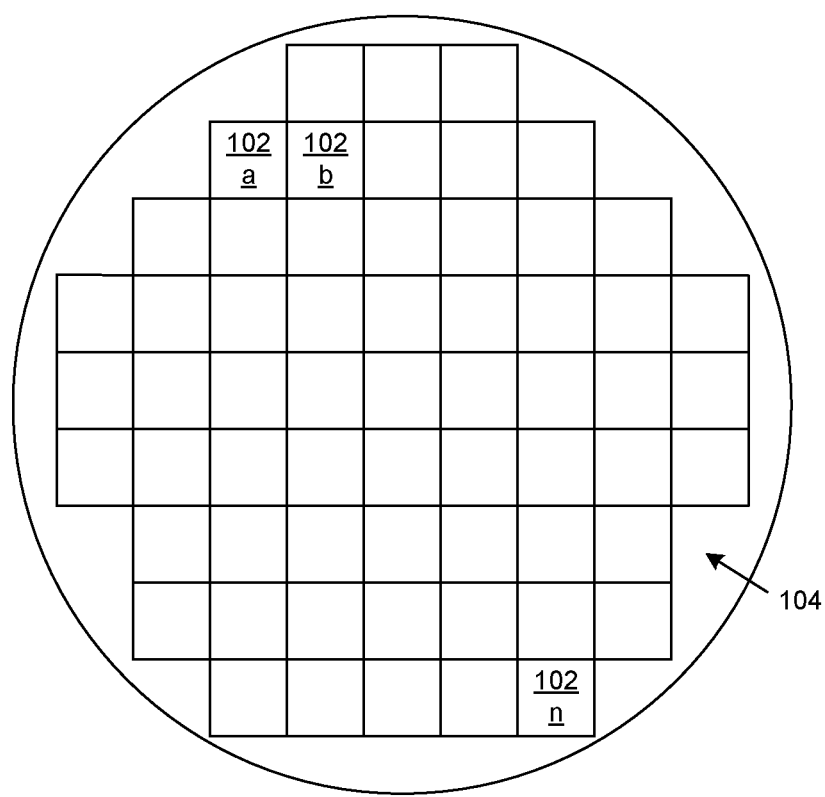
FIG. 1 illustrates a top-down view of semiconductor devices formed on a wafer in an embodiment according to the present invention.

FIG. 1 illustrates semiconductor devices 102a-102n formed on a wafer 104 in an embodiment according to the present invention. The devices 102a-102n may be referred to as dies. In an embodiment, the wafer 104 is made of a semiconductor material such as silicon. The wafer 104 may also be referred to as a substrate.

Figure 2:
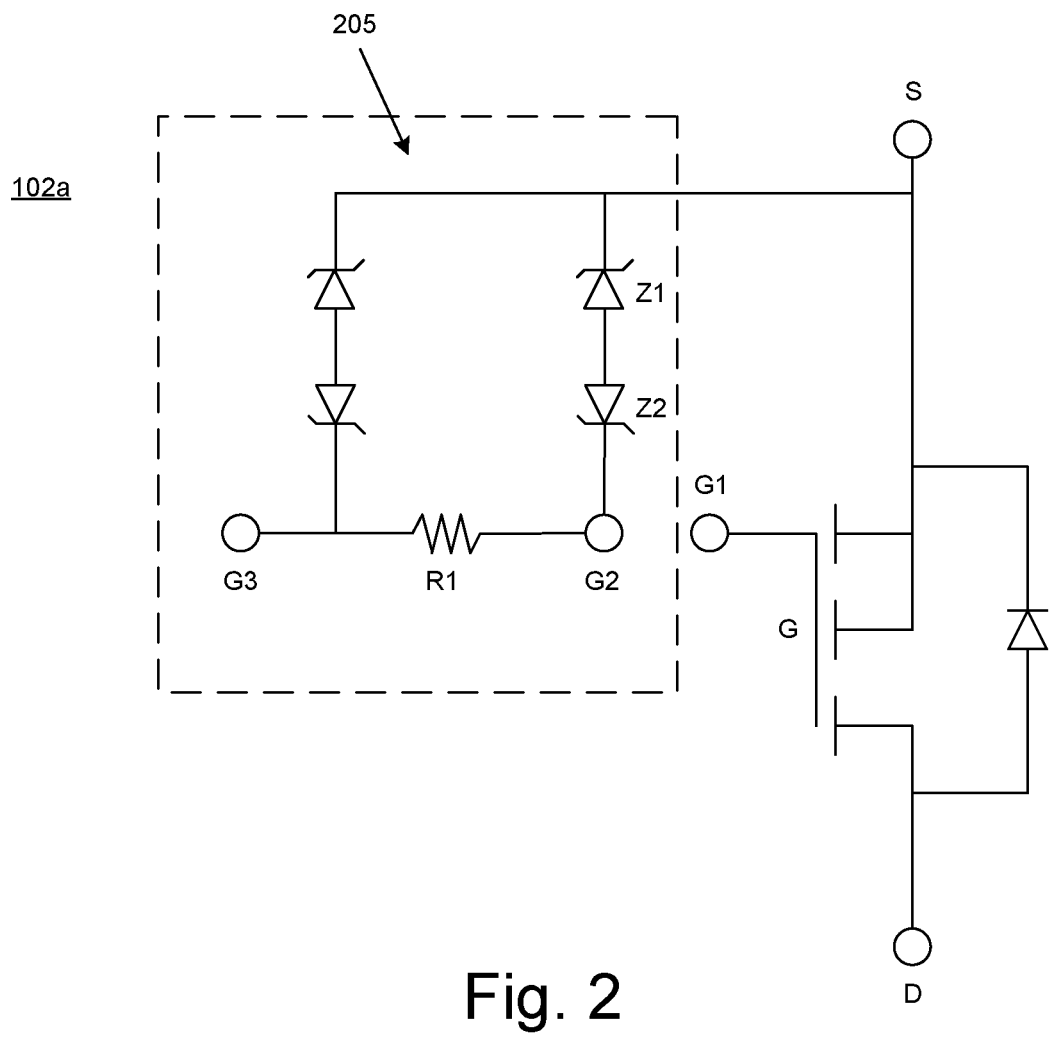
FIG. 2 is a schematic diagram illustrating an example of a semiconductor device in an embodiment according to the present invention.

FIG. 2 is a schematic diagram illustrating an example of the semiconductor device (die) 102a on the wafer 104 (FIG. 1) in an embodiment according to the present invention. Only a portion of the device 102a is shown. In the example of FIG. 2, the device 102a is a p-channel device although the present invention is not so limited. In an embodiment, the semiconductor device is a "vertical device" such as a MOSFET. As used herein, a vertical device is a device in which, if the gate and source are on the top of the device and the drain is at the bottom of the device, then the current flows from the top to the bottom.

The device 102a includes a source S, a drain D, a gate G, and a first gate pad G1 connected to the gate. The gate G includes a gate oxide layer (not shown). The device 102a also includes a second gate pad G2. In an embodiment, the device 102a also includes a third gate pad G3.

In the FIG. 2 embodiment, the second gate pad G2 and the third gate pad G3 are part of an electro-static discharge (ESD) protection network 205 for the device 102a. As will be described further herein, in earlier stages of the device fabrication process, the first gate pad G1 is electrically isolated from the second gate pad G2 and from the third gate pad G3 as shown in FIG. 2. Thus, at the point in the fabrication process captured in FIG. 2, the ESD protection network 205 is isolated from the first gate pad G1. Accordingly, gate oxide integrity (GOI) testing can be effectively performed and the reliability and quality of the gate oxide layer in the device 102a can be checked. Specifically, a voltage can be applied to the first gate pad G1 using a wafer prober, to stress test the gate oxide layer at a voltage that is greater than the rated voltage. For example, if the gate oxide layer is rated for operation at 20 volts (V), then the stress test can be performed by applying 30 V to the first gate pad G1.

Figure 5A:
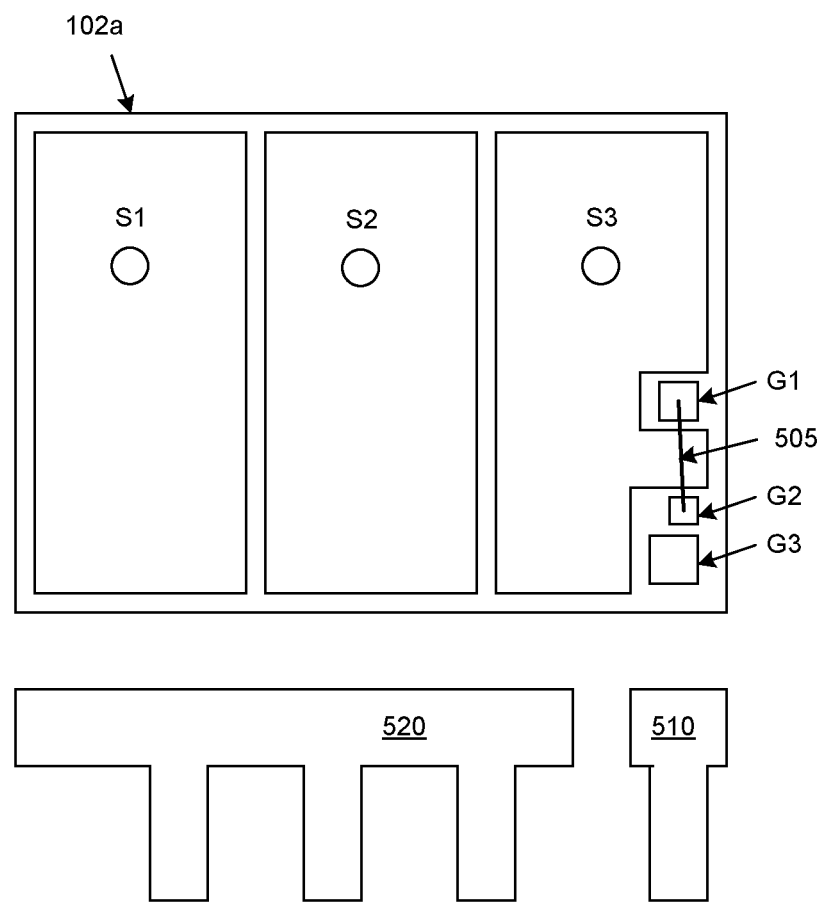
FIG. 5A is a top-down view illustrating a connection between gate pads in an embodiment according to the present invention.
Figure 5B:
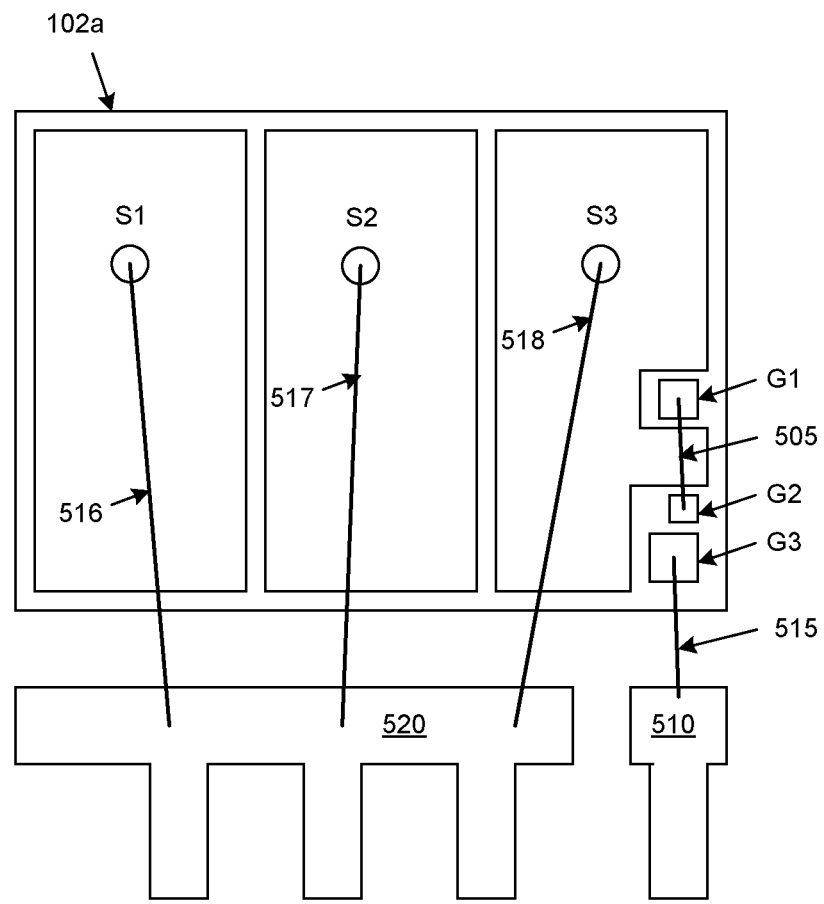
FIG. 5B is a top-down view illustrating a packaged semiconductor device in an embodiment according to the present invention.

As shown in FIG. 5A, described further below, sometime after the GOI testing is completed (after the test voltage is removed from the first gate pad G1), the first gate pad and the second gate pad G2 are connected (e.g., wire-bonded), thereby enabling the ESD protection network 205. As shown in FIG. 5B, described further below, the third gate pad G3 can be connected (e.g., wire-bonded) to a terminal that is external to the die when the device 102a is packaged.

In the FIG. 2 embodiment, the ESD protection network 205 is a two-stage ESD network and includes a resistor R1 and at least two Zener diodes Z1 and Z2. In another embodiment, the ESD protection network is a one-stage ESD network and includes a single Zener diode. Devices such as bipolar junction transistors (BJTs), MOSFETs, or silicon-controlled rectifiers (SCRs) can be used instead of the diodes Z1 and Z2, and the resistor R1 can be, for example a silicon diffusion resistor, a silicon pinch resistor, a planar polysilicon resistor, or a trench polysilicon transistor. Other types and configurations of ESD protection networks can be used.

Figure 3:
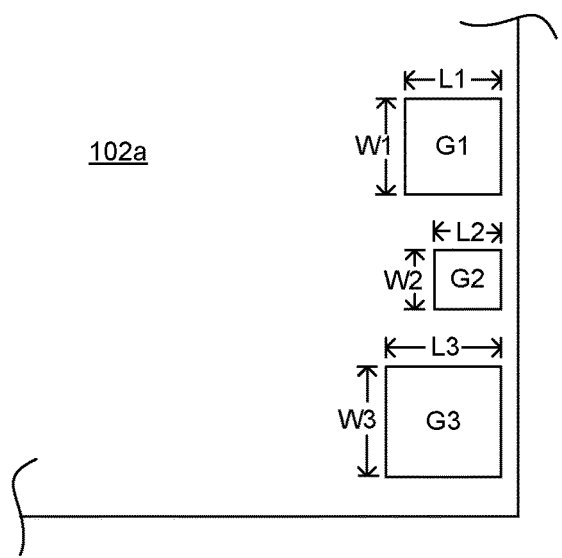
FIG. 3 illustrates a top-down view of an example of a layout of gate pads on the surface of a semiconductor device in an embodiment according to the present invention.

FIG. 3 illustrates a top-down view of an example of a layout of the first, second, and third gate pads G1, G2, and G3 on the surface of the semiconductor device (die) 102a on the wafer 104 (FIG. 1) in an embodiment according to the present invention. The first gate pad G1 has an area of L1 times W1 (L1×W1), the second gate pad G2 has an area of L2×W2, and the third gate pad G3 has an area of L3×W3. In an embodiment, the area occupied by the first gate pad G1 is less than the area occupied by the third gate pad G3, and the area occupied by the second gate pad G2 is less than the area occupied by the third gate pad. In an embodiment, the areas of the first, second, and third gate pads G1, G2, and G3 are all different from each other.

Figure 4:
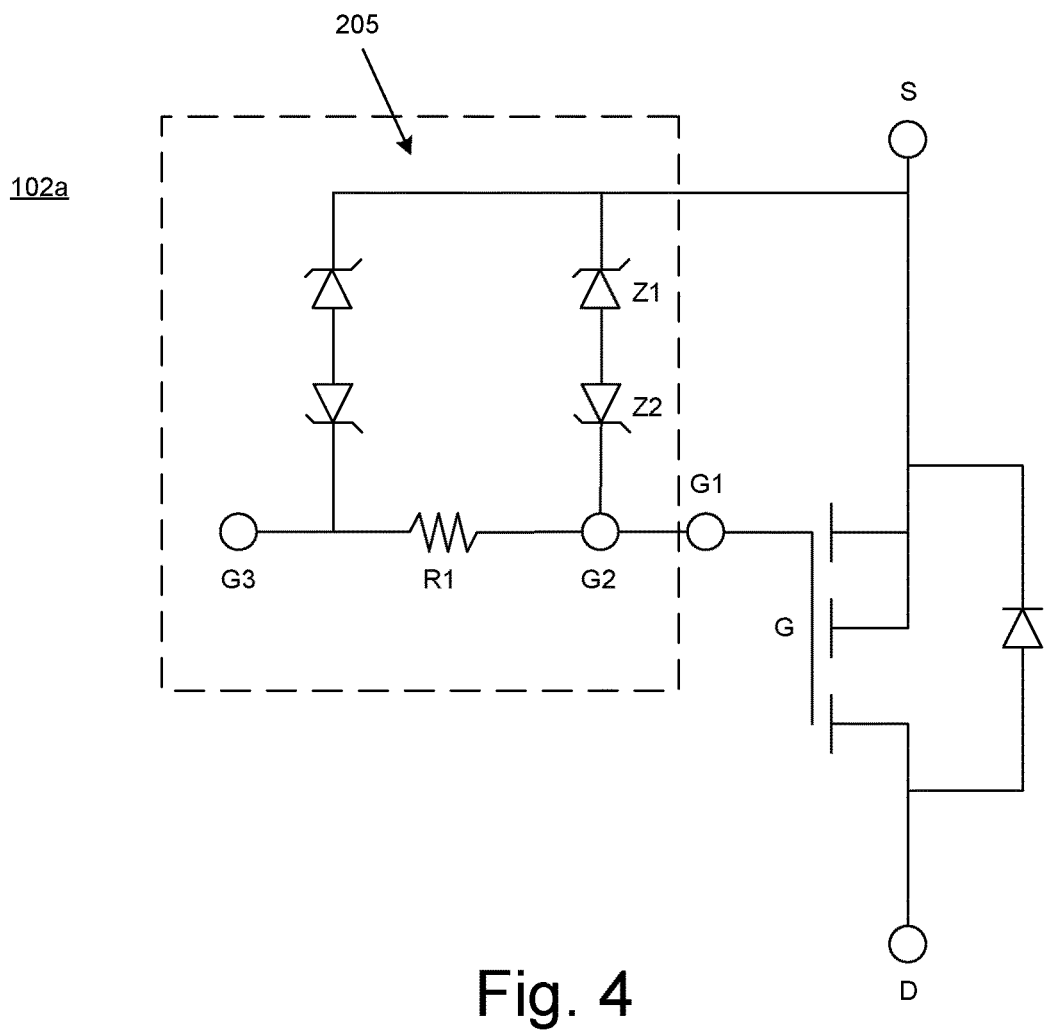
FIG. 4 is a schematic diagram illustrating an example of a semiconductor device in an embodiment according to the present invention.

FIG. 4 is a schematic diagram illustrating an example of the semiconductor device 102a (die) on the wafer 104 (FIG. 1) in an embodiment according to the present invention. As mentioned above in the discussion of FIG. 2, the first gate pad G1 is initially electrically isolated from the second gate pad G2 and from the third gate pad G3. At the point in the fabrication process captured in FIG. 4, the first gate pad G1 is connected to the second gate pad G2 and thus is no longer isolated from the ESD protection network 205. In other words, the ESD protection network 205 is enabled and functional.

FIG. 5A is a top-down view illustrating a connection between the first gate pad G1 and the second gate pad G2 in the semiconductor device (die) 102a on the wafer 104 (FIG. 1) in an embodiment according to the present invention. In an embodiment, a bonding wire 505 is used to connect the first and second gate pads G1 and G2 and thus connect the main portion of the device 102a to the ESD protection network 205 (FIG. 4). Other mechanisms can be used to form the connection between the first and second gate pads G1 and G2. For example, an anti-fuse can be formed between the first and second gate pads G1 and G2, and then a voltage can be applied to the anti-fuse to form the connection between the first and second gate pads in a known manner.

The connection between the first and second gate pads G1 and G2 is formed after the gate oxide layer is stress tested (after the test voltage is removed from the first gate pad G1). In an embodiment, the ESD protection network 205 is also tested before the first and second gate pads G1 and G2 are connected.

After the point in the fabrication process captured in FIG. 5A, the semiconductor device 102a is packaged. In the packaging stage, the device 102a is separated from the wafer 104 (FIG. 1). FIG. 5B is a top-down view illustrating the packaged device 102a including a connection 515 between the third gate pad G3 and a terminal 510 that is external to the device 102a in an embodiment according to the present invention. In an embodiment, a bonding wire is used to connect the third gate pad G3 and the external terminal 510. The connection between the third gate pad G3 and terminal 510 is formed after the gate oxide layer is stress tested (after the test voltage is removed from the first gate pad G1). After the connection between the third gate pad G3 and the terminal 510 is formed (after packaging), the packaged device 102a can be tested.

FIG. 5B also shows connections 516, 517, and 518 (e.g., wire bonds) between sources S1, S2, and S3 in the device 102a and an external terminal 520 after packaging.

Figure 6:
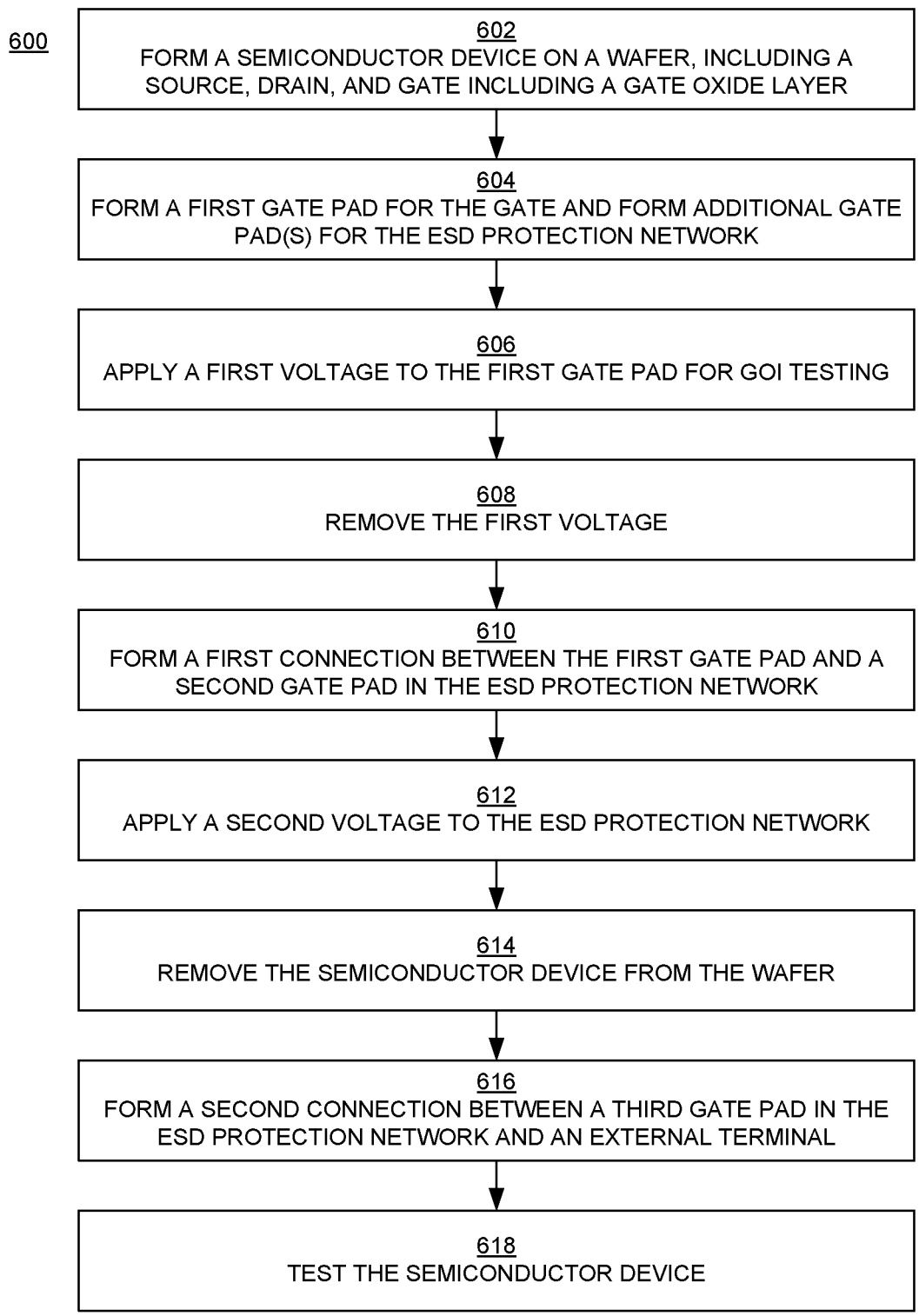
FIG. 6 is a flowchart of a method for fabricating and/or testing a semiconductor device in an embodiment according to the present invention.

FIG. 6 is a flowchart 600 of a method for fabricating and/or testing a semiconductor device (e.g., the semiconductor device 102a of FIG. 1) in an embodiment according to the present invention. FIG. 6 is discussed in the context of a single semiconductor device; the described operations can be performed for each semiconductor device (die) on the wafer 104 (FIG. 1).

In block 602 of FIG. 6, with reference also to FIGS. 1 and 2, a source S, a drain D, and a gate G including a gate oxide layer are formed on a wafer 104 as part of a semiconductor device (die) 102a. The semiconductor device can have more than one source and more than one gate.

In block 604 of FIG. 6, with reference also to FIG. 2, a first gate pad G1 and a second gate pad G2 are formed. In an embodiment, a third gate pad G3 is also formed. The first gate pad G1 is connected to the gate G. The second gate pad G2 and the third gate pad G3 are part of and are connected to the ESD protection network 205. The first gate pad G1 is electrically isolated from the ESD protection network 205.

In block 606 of FIG. 6, with reference also to FIG. 2, with the semiconductor device 102a on the wafer 104 (FIG. 1), a first voltage is applied to the first gate pad G1, for GOI testing. In an embodiment, the first voltage is greater than the rated voltage of the gate oxide layer.

In block 608 of FIG. 6, with reference also to FIG. 2, the first voltage is removed from the first gate pad G1.

In block 610 of FIG. 6, with reference also to FIGS. 4 and 5A, after the first voltage is removed from the first gate pad G1, a first electrical connection 505 is formed between the first gate pad and the second gate pad G2 in the ESD protection network 205.

In block 612 of FIG. 6, in an embodiment, a second voltage is applied to the ESD protection network 205 (FIG. 4) after the first voltage is removed from the first gate pad G1 and before the first electrical connection between the first gate pad G1 and the second gate pad G2 is formed, in order to test the ESD protection network.

In block 614 of FIG. 6, the semiconductor device 102a is removed from the wafer 104 (FIG. 1).

In block 616 of FIG. 6, with reference also to FIG. 5B, a second electrical connection 515 is formed between the third gate pad G3 and the terminal 510 that is external to the semiconductor device 102a. Other packaging operations including the connection of the sources S1, S2, and S3 to the terminal 520 can also be performed.

In block 618 of FIG. 6, with reference also to FIG. 5B, in an embodiment, the semiconductor device 102a is tested after the second electrical connection 515 between the third gate pad G3 and the terminal 510 is formed.

In FIG. 6, operations described as separate blocks may be combined and performed in the same process step (that is, in the same time interval, after the preceding process step and before the next process step). Also, the operations may be performed in a different order than the order in which they are described below. Furthermore, fabrication processes and steps may be performed along with the processes and steps discussed herein; that is, there may be a number of process steps before, in between, and/or after the steps shown and described herein. Importantly, embodiments according to the present invention can be implemented in conjunction with these other (perhaps conventional) processes and steps without significantly perturbing them. Generally speaking, embodiments according to the present invention can replace portions of a conventional process without significantly affecting peripheral processes and steps.

Embodiments of semiconductor devices and of methods of fabricating and/or testing the semiconductor devices are thus described. In these embodiments, semiconductor devices, such as but not limited to power MOSFETs. The features described herein can be used in lower voltage devices (e.g., in the range of 100-250 V) as well as higher voltage devices (e.g., in the range of 400-600 V).

In summary, in embodiments according to the present invention, semiconductor devices include additional gate pads that are part of an ESD protection network. The additional gate pads, and hence the ESD protection network, are initially isolated from the gate pad coupled to the device's gate and the gate oxide layer. Thus, embodiments according to the invention allow GOI testing to be performed without the GOI testing being effected by the ESD protection network.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor device, comprising:
    a gate comprising a gate oxide layer;
    a source terminal;
    a drain terminal;
    a first gate pad coupled to a substrate and also coupled to the source and drain terminals and to the gate, wherein the first gate pad receives a first voltage during gate oxide integrity (GOI) testing, and wherein the first voltage is greater than the rated operational voltage of the gate oxide layer;
    a second gate pad coupled to the substrate, wherein the second gate pad comprises a portion of an electro-static discharge (ESD) protection network for the semiconductor device and is electrically isolated from the first gate pad at all times during the GOI testing, and wherein the ESD protection network is electrically isolated from the first gate pad and the first voltage during the GOI testing;
    a third gate pad coupled to the substrate, wherein the third gate pad also comprises a portion of the ESD protection network and is electrically isolated from the first gate pad at all times during the GOI testing, and wherein the first gate pad occupies less area of the semiconductor device than the third gate pad, and wherein the second gate pad occupies less area of the semiconductor device than the third gate pad; and
    an anti-fuse disposed between and coupled to the first and second gate pads, wherein an electrical connection is formed between the first and second gate pads in response to a voltage that is applied to the anti-fuse, to enable the ESD protection network and to also enable a connection between the gate of the semiconductor device and a terminal that is external to the semiconductor device.

2. The semiconductor device of claim 1, further comprising a wire bond that connects the third gate pad and a terminal that is external to the semiconductor device.

3. The semiconductor device of claim 1, wherein the substrate comprises a wafer having a plurality of other semiconductor devices formed thereon, wherein the first gate pad is electrically isolated from the second gate pad and from the third gate pad.

4. The semiconductor device of claim 1, further comprising a wire bond connecting the source terminal and a terminal that is external to the semiconductor device.

5. The semiconductor device of claim 1, wherein the ESD protection network is selected from the group consisting of: a two-stage ESD network comprising a resistor and at least two Zener diodes; and a one-stage ESD network comprising a Zener diode.

6. The semiconductor device of claim 1, comprising a vertical device comprising a metal-oxide-semiconductor field-effect transistor (MOSFET).

7. A method of fabricating a semiconductor device, the method comprising:
    forming a gate on a substrate, the gate comprising a gate oxide layer;
    forming a first gate pad coupled to the gate, wherein the first gate pad is operable for receiving a first voltage during gate oxide integrity (GOI) testing, and wherein the first voltage is greater than the rated operational voltage of the gate oxide layer;
    forming a source terminal coupled to the first gate pad;
    forming a drain terminal coupled to the first gate pad;
    forming a second gate pad coupled to the substrate, wherein the second gate pad comprises a portion of an electro-static discharge (ESD) protection network for the semiconductor device and is configured to be electrically isolated from the first gate pad at all times during the GOI testing, and wherein the ESD protection network is configured to be electrically isolated from the first gate pad and the first voltage during the GOI testing;
    forming a third gate pad coupled to the substrate, wherein the third gate pad also comprises a portion of the ESD protection network and is electrically isolated from the first gate pad at all times during the GOI testing, wherein the first gate pad occupies less area of the semiconductor device than the third gate pad, and wherein the second gate pad occupies less area of the semiconductor device than the third gate pad; and
    forming an anti-fuse disposed between and coupled to the first and second gate pads, wherein an electrical connection is formed between the first and second gate pads in response to a voltage that is applied to the anti-fuse, to enable the ESD protection network and to also enable a connection between the gate of the semiconductor device and a terminal that is external to the semiconductor device.

8. The method of claim 7, further comprising forming a wire bond that connects the third gate pad and a terminal that is external to the semiconductor device.

9. The method of claim 7, wherein the substrate comprises a wafer having a plurality of other semiconductor devices formed thereon, wherein the first gate pad is electrically isolated from the second gate pad and from the third gate pad.

10. The method of claim 7, wherein the ESD protection network is selected from the group consisting of: a two-stage ESD network comprising a resistor and at least two Zener diodes; and a one-stage ESD network comprising a Zener diode.

11. The method of claim 7, wherein the semiconductor device comprises a vertical device comprising a metal-oxide-semiconductor field-effect transistor (MOSFET).

* * * * *